(12) United States Patent
Kim et al.

(10) Patent No.: US 8,267,253 B2
(45) Date of Patent: Sep. 18, 2012

(54) CARRIER AND MANUFACTURING APPARATUS HAVING THE SAME

(75) Inventors: Sung Eun Kim, Woolsan-si (KR); Yang Sik Moon, Seoul (KR); Jong Bum Jung, Daegu-si (KR)

(73) Assignee: LG Display Co., Ltd., Seoul (KR)

( * ) Notice: Subject to any disclaimer, the term of this patent is extended or adjusted under 35 U.S.C. 154(b) by 483 days.

(21) Appl. No.: 11/476,362

(22) Filed: Jun. 27, 2006

(65) Prior Publication Data

US 2007/0045110 A1 Mar. 1, 2007

(30) Foreign Application Priority Data

Aug. 31, 2005 (KR) .................. 10-2005-0081003

(51) Int. Cl.
*B65D 85/00* (2006.01)

(52) U.S. Cl. ........................ 206/710; 269/903

(58) Field of Classification Search .................. 206/710, 206/557, 565, 454, 712, 455; 248/682, 678, 248/679, 346.01, 576, 577, 81, 581, 591; 269/48.4, 43, 45, 152, 54.4, 54.5, 254 CS, 269/254 R, 900, 903, 21, 289 R; 211/41.18, 211/40, 41.1, 41.17, 41.14, 41.13, 41.12; 204/298.25; 438/464

See application file for complete search history.

(56) References Cited

U.S. PATENT DOCUMENTS

| | | | | |
|---|---|---|---|---|
| 593,024 A * | 11/1897 | Kinsey | | 206/5 |
| 2,156,832 A | 5/1939 | Ayers | | |
| 2,531,543 A * | 11/1950 | Sutphen | | 206/499 |
| 4,074,422 A * | 2/1978 | Borjesson et al. | | 29/730 |
| 4,312,716 A * | 1/1982 | Maschler et al. | | 205/128 |
| 4,407,654 A * | 10/1983 | Irwin | | 432/258 |
| 4,872,554 A * | 10/1989 | Quernemoen | | 206/454 |
| 5,080,774 A * | 1/1992 | Heitzer | | 204/298.11 |
| 5,259,603 A | 11/1993 | Geisler et al. | | |
| 5,472,099 A * | 12/1995 | Terashima | | 211/41.18 |
| 5,704,493 A * | 1/1998 | Fujikawa et al. | | 211/41.16 |
| 5,960,960 A * | 10/1999 | Yamamoto | | 206/711 |
| 6,056,123 A * | 5/2000 | Niemirowski et al. | | 206/711 |
| 6,092,981 A * | 7/2000 | Pfeiffer et al. | | 414/810 |
| 6,171,400 B1 * | 1/2001 | Wingo | | 118/500 |
| 6,207,026 B1 * | 3/2001 | Crocker | | 204/192.12 |

(Continued)

FOREIGN PATENT DOCUMENTS

JP  10-116891  5/1998

(Continued)

OTHER PUBLICATIONS

Office Action issued in corresponding Chinese Patent Application No. 200610100139.9; issued Mar. 23, 2010.

(Continued)

*Primary Examiner* — Jacob K Ackun
*Assistant Examiner* — Jenine Pagan
(74) *Attorney, Agent, or Firm* — Brinks Hofer Gilson & Lione

(57) ABSTRACT

A carrier having a plurality of support bars for safely transferring a substrate is provided. The carrier includes a frame having a through-hole formed at a center, the center through-hole including a first inner surface and a second inner surface that faces the first inner surface within in the through-hole; and a plurality of support bars joined to the first inner surface and the second inner surface.

20 Claims, 21 Drawing Sheets

U.S. PATENT DOCUMENTS

| | | | |
|---|---|---|---|
| 6,237,979 B1* | 5/2001 | Korn et al. | 294/159 |
| 6,318,389 B1* | 11/2001 | Schmidt et al. | 134/201 |
| 6,634,882 B2* | 10/2003 | Goodman | 432/253 |
| 6,814,808 B1* | 11/2004 | Gados et al. | 118/500 |
| 7,588,150 B2* | 9/2009 | Kasama | 206/710 |
| 2002/0130061 A1* | 9/2002 | Hengst | 206/710 |
| 2003/0146129 A1* | 8/2003 | Tseng et al. | 206/711 |
| 2004/0108284 A1* | 6/2004 | Huang et al. | 211/41.18 |
| 2004/0134830 A1* | 7/2004 | Aoki | 206/710 |
| 2004/0200788 A1* | 10/2004 | Shon et al. | 211/41.18 |
| 2005/0098877 A1* | 5/2005 | Adachi et al. | 257/706 |

FOREIGN PATENT DOCUMENTS

KR  1020010032918 A  4/2001

OTHER PUBLICATIONS

Office Action issued in corresponding Korean Patent Application No. 10-2005-0081003, mailed Nov. 23, 2011.

* cited by examiner

FIG.4
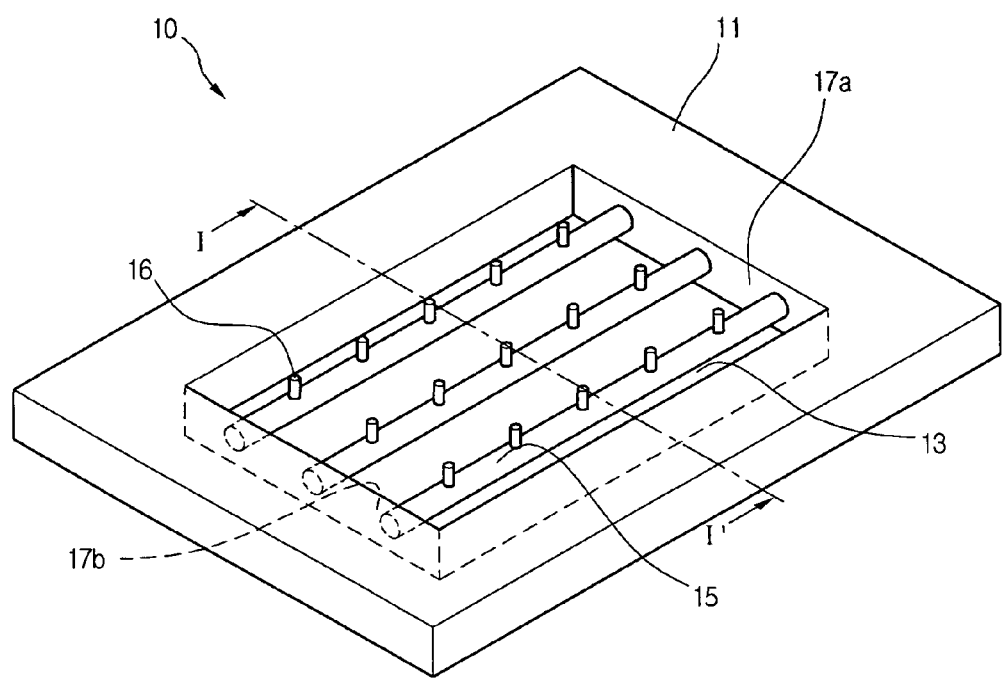
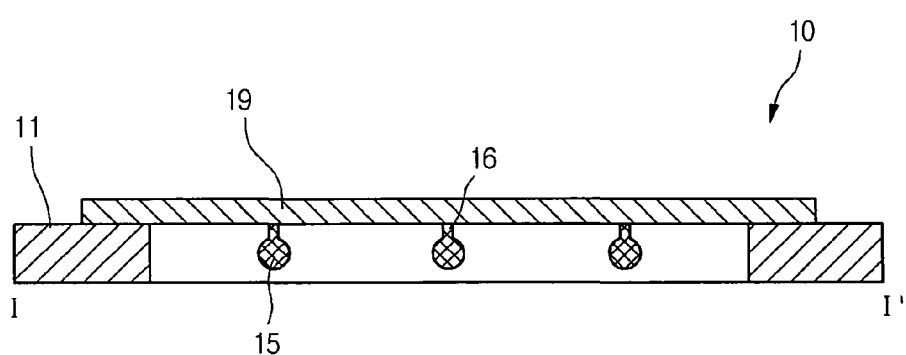
FIG.5

CARRIER AND MANUFACTURING APPARATUS HAVING THE SAME

CROSS REFERENCE TO RELATED APPLICATIONS

This application claims priority from Korean patent application serial number 81003/2005, filed on Aug. 31, 2005 in the Korean Intellectual Property Office, the disclosure of which is fully incorporated by reference herein.

FIELD OF THE INVENTION

The present invention relates to a carrier, and more particularly, to a carrier for safely transferring a substrate without impact on the substrate even in a high temperature process, and a manufacturing apparatus having the same.

DESCRIPTION OF THE RELATED ART

Manufacturing apparatuses repeatedly perform a plurality of manufacturing processes, e.g., a layer forming process and an etching process, on a substrate such as a semiconductor wafer or a liquid crystal display (LCD) substrate. In order to perform such manufacturing processes, the manufacturing apparatus includes a plurality of chambers designed for each of the manufacturing processes and a carrier for transferring the substrate from a chamber to another chamber.

Especially, a sputtering apparatus for forming a thin film is an essential component for manufacturing a semiconductor device or an LCD.

Referring to FIG. 1, the related art sputtering apparatus includes a target 131, a cathode 132 and a magnet 133 which are disposed at one side of the sputtering apparatus. The sputtering apparatus further includes a seethe heater 135 disposed at other side facing the target 131. A substrate 140 is transferred to the sputtering apparatus. In order to transfer the substrate 140, a top carrier 138b and a bottom carrier 138a normally hold the substrate vertically. The top carrier 138b normally includes a first magnet 139 with a predetermined polarity. A second magnet 136 that has the opposite polarity as the first magnet 139 is disposed at an upper portion in the sputtering apparatus. A metal belt 137 is attached at a bottom surface of the bottom carrier 138a and is provided transfer the substrate 140. A vacuum pump 141 may be provided to form a vacuum within a sputtering chamber unit.

When the top and bottom carriers 138b and 138a and the substrate 140 are transferred by the metal belt 137 to reach a predetermined location within the sputtering apparatus, the top and bottom carriers 138b, 138a and the substrate 140 are maintained at the predetermined location by magnetic attraction created by the magnets 139 and 136. After the top and bottom carriers 138b and 138a are positioned at the predetermined location, a voltage is supplied to the cathode 132 to form positive ions of a gas plasma 154. Target material atoms are ejected from the target 131 and are deposited on the substrate 140. After the depositing process, the metal belt 137 may transfer the substrate 140 to another chamber for a next manufacturing process.

The carrier 138 includes a clamp (not shown) to hold the substrate 140 while transferring the substrate 140. The carrier 138 generally includes a rectangle frame with a through-hole 142 in the center of the carrier 138.

In embodiments where the substrate is relatively small, the substrate 140 may be held by the clamp.

As an LCD panel becomes larger, and a size of a corresponding substrate becomes accordingly larger. When the carrier 138 supports a large substrate, a center portion of the large sized substrate may bend toward a bottom through the through-hole 142 formed at the center of the carrier 138.

As shown schematically in FIG. 1, the carrier 138 may hold the substrate 140 in a substantially vertical orientation. The carrier 138 may alternatively hold the substrate 140 in a substantially horizontal orientation.

As described above, if the carrier 138 holds a relatively large substrate 140, the substrate 140 may be damaged if the substrate 140 is bent toward the bottom through the hole 142 formed at the center of the carrier 138.

Additionally, the substrate 140 receives an instant force generated when the carrier 138 is stopped and started during the transfer process, which may damage the substrate.

SUMMARY OF THE INVENTION

The present invention is directed to a carrier and a manufacturing apparatus. An object of the present invention is to provide a carrier for safely transferring a substrate and a manufacturing apparatus.

Another object of the present invention is to provide a carrier for safely transferring a substrate regardless of any deformation of a support bar by connecting the support bar to an elastic unit.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a carrier including: a frame having a through-hole formed at a center, a first inner surface within the through-hole and a second inner surface within the through-hole facing the first inner surface; and a plurality of support bars joined to the first inner surface and the second inner surface.

In another aspect of the present invention, there is provided a manufacturing apparatus including: a process chamber; and a carrier having support bars for supporting a substrate while transferring the substrate into the process chamber and transferring the substrate out of the process chamber.

The carrier according to the present invention includes a plurality of support bars in the center of the carrier to support the substrate to prevent the substrate from bending toward the bottom of the carrier. Accordingly, the carrier as constructed in accordance with the present invention prevents a substrate from being damaged.

Also, the carrier according to the present invention may include an elastic unit disposed between a support bar and the frame in order to allow the support bar to move when the support bar is deformed. Accordingly, the carrier according to the present invention is not deformed although the support bar is deformed by high temperature and high pressure. Therefore, the carrier according to the present invention prevents a substrate placed on the carrier from being damaged.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 4 is a perspective view of a carrier according to a first embodiment of the present invention.

FIG. 5 is a cross-sectional view taken along line I-I' of FIG. 4.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
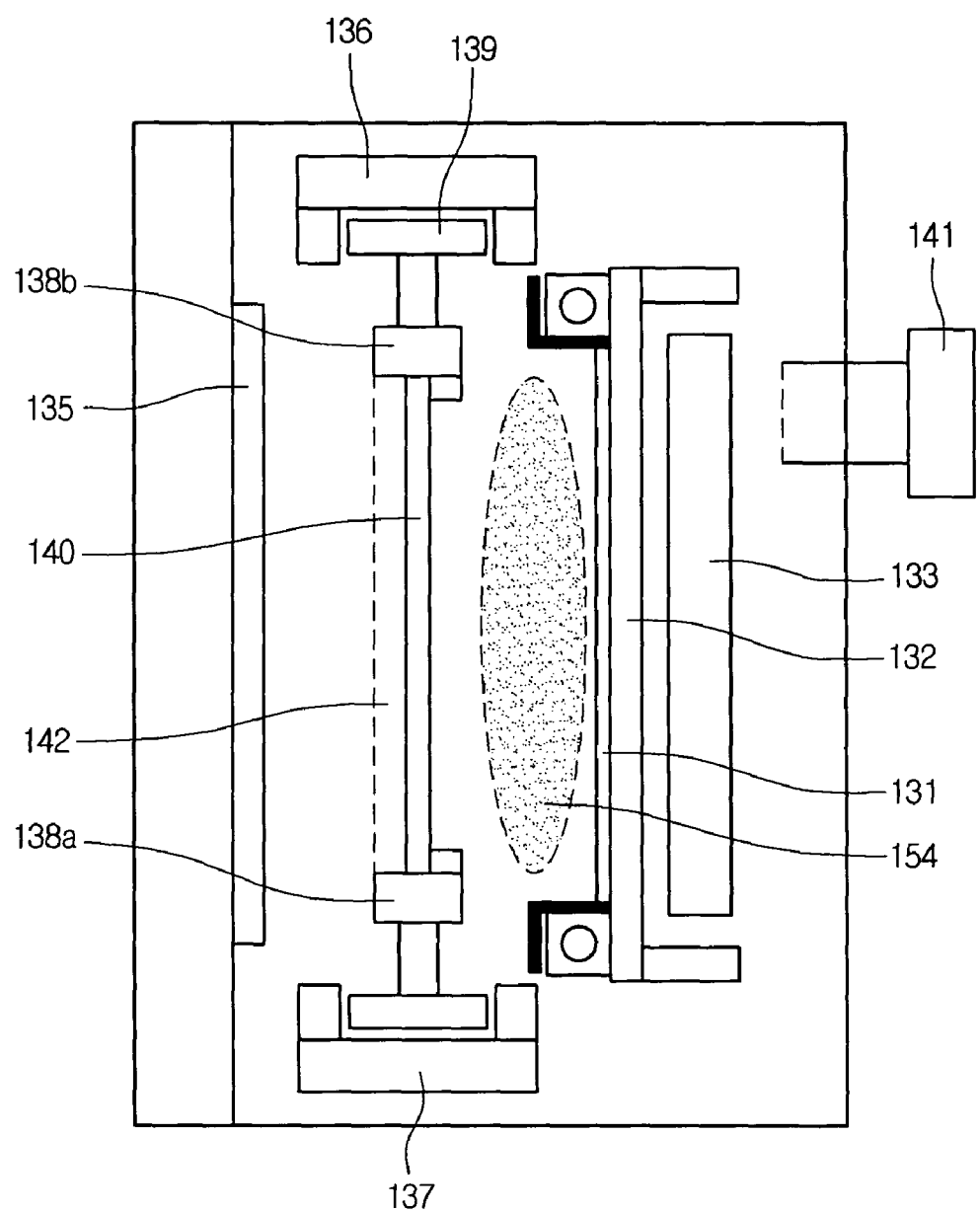
FIG. 1 is a schematic view of a related art sputtering apparatus.
Figure 2:
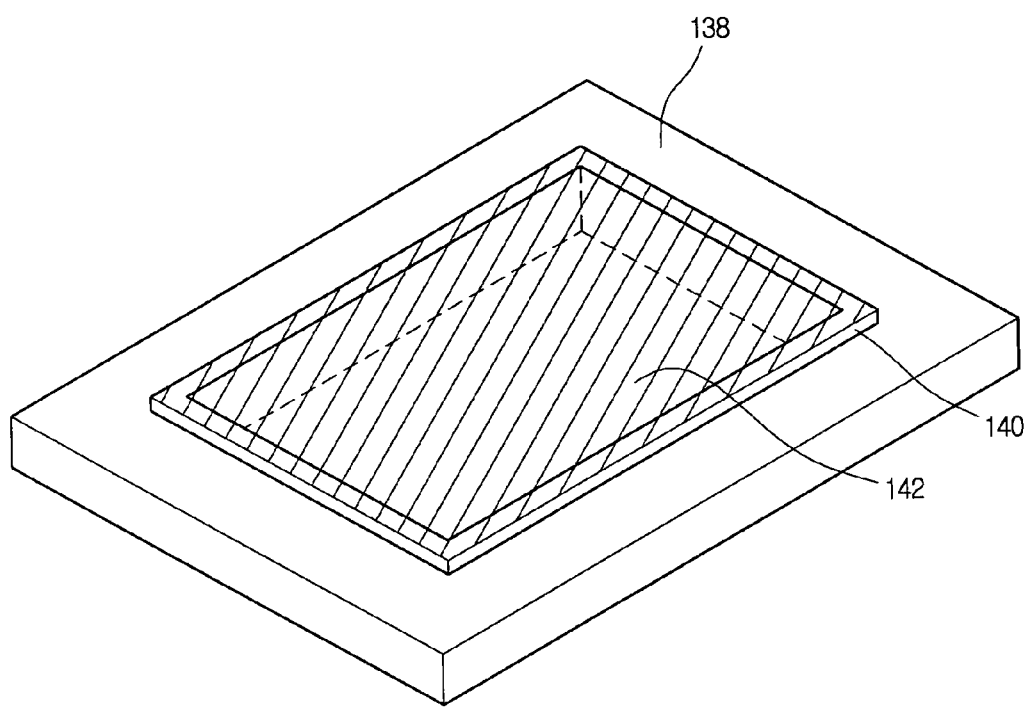
FIG. 2 is a perspective view of a related art carrier.
Figure 3:
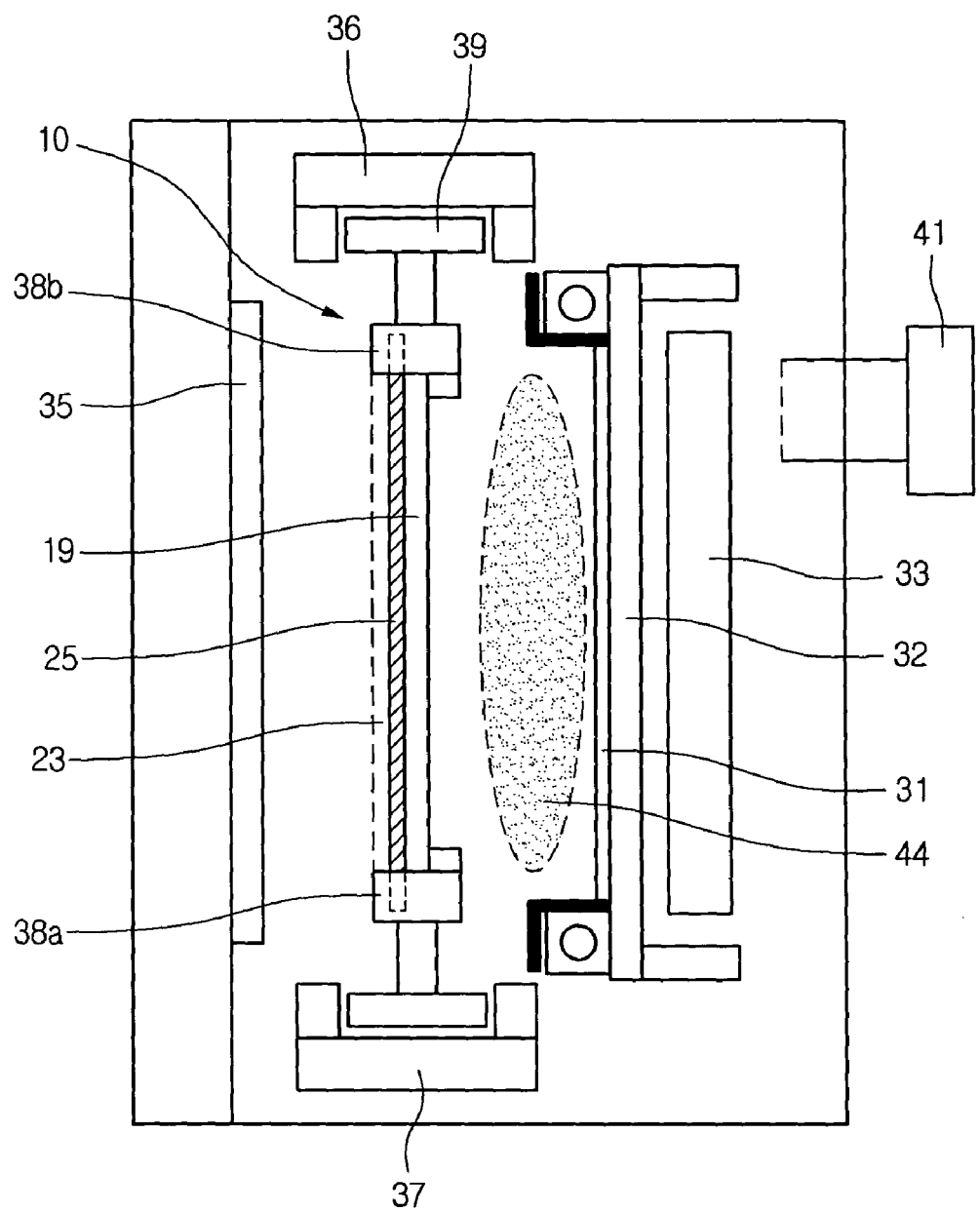
FIG. 3 is a schematic view of a sputtering apparatus according to an embodiment of the present invention.

As shown in FIG. 3, a sputtering apparatus includes a target 31, a cathode 32 and a magnet 33 at one side thereof. The sputtering apparatus further includes a seethe heater 35 disposed at the opposite side of the cathode 32 from the magnet 33, facing the target 31. A substrate 19 may be transferred to the sputtering apparatus with a top carrier 38b and a bottom carrier 38a that vertically hold the substrate 19 within the sputtering apparatus. A first magnet 39 having a predetermined polarity is disposed on the top carrier 38b, and a second magnet 36 having an opposite polarity from the first magnet 39 is disposed at an upper portion of the sputtering apparatus. A metal belt 37 is attached to a bottom surface of the bottom carrier 38a to transfer the substrate 19 through the apparatus. A vacuum pump 41 may be provided to from a vacuum within the sputtering chamber.

When the top and bottom carriers 38b, 38a and the substrate 40 reach a predetermined location in the sputtering apparatus on the metal belt 37, the top and bottom carriers 38b, 38a are retained at the predetermined location within the apparatus by magnetic attraction between the magnets 39 and 36. After the top and bottom carriers 38b and 38a reach and are retained in the predetermined location, a voltage is supplied to the cathode 32, forming positive ions of a gas plasma. As a result, target material atoms are ejected from the target 31 are deposited on the substrate 40. After the depositing process, the metal belt 37 may transfer the substrate 40 to another chamber for a next manufacturing process.

A clamp (not shown) on the carrier 10 may hold or retain the substrate 19 while the substrate is being transferred. The carrier 10 may be formed with a rectangular frame and a through-hole 13 in the center of the frame.

A plurality of support bars 15 may be disposed within the through-hole 13 of the carrier 10. Each of the support bars 15 includes an end joined to a first inner surface 17a of the through-hole 13 and an opposite end joined to a second inner surface 17b of the through-hole 13 of the carrier 10.

The one end of the support bar 15 is inserted into a predetermined shaped groove which is formed at the first inner surface 17a. The groove includes a predetermined separation space, or a cavity between the support bar 15 and the frame 21, which prevents the carrier 10 from being deformed when the support bar 15 is deformed or expanded due to high temperatures or pressures. Specifically, the separation space is provided with respect to the bottom of the support bar 15 to allow room for the support bar 15 to thermal expansion or deformation due to a high pressure environment. In other embodiments, the carrier 10 may be positioned horizontally when being transferred. In still other embodiments, the carrier 10 may be transferred at a predetermined oblique angle.

As shown in FIGS. 4 and 5, the carrier 10 includes a frame 11 having a rectangular through-hole 13 formed at a center thereof. In some embodiments, the through-hole 13 may be a corresponding rectangular shape. Support bars 15 are provided and selectively arranged between a first inner surface 17a and a second inner surface 17b within the through-hole 13. As shown in FIG. 4, the first and second inner surfaces 17a, 17b face each other. Accordingly, a first end of the support bar 15 is joined to the first inner surface 17a of the through-hole 13 and a second end of the support bar 15 is connected to the second inner surface 17b of the through-hole 13.

Each of the plurality of support bars 15 may include a plurality of sub bars 16 that are projected toward a front portion of the carrier frame 11. The sub bars 16 are normally provided on the support bars 15 at a predetermined distance from the neighboring sub bars 16. Additionally, the sub bars 16 are normally formed at constant heights. The sub bars 16 may be provided to prevent the substrate from bending toward the bottom of the carrier 10 because of the space between the top surface of the carrier 10 and the top surface of the support bar 15 and the weight of the substrate. In some embodiments, where the space difference between the top surface of the carrier 10 and the top surface of the support bar 15 is small the support bar 15 does not include the sub bars 16. The carrier 10 includes a clamp (not shown) to fasten the substrate.

The carrier 10 may be formed of a resin-based material that is sufficiently durable to resist or reduce deformation in a high temperature or a high pressure environment. The support bars 15 may be made from the same material as the carrier 10, or may be made of different material compared to the carrier 10. The sub bars 16 (when provided) may be made from the same material as the support bars 15 or the sub bars 16 may be manufactured from a different material than the supports bar 15. In other embodiments, the sub bars 16 may be formed from different materials within the carrier 10.

The support bars 15 may be formed as the same component as the carrier 10. Alternatively, the support bars 15 may formed separately from the carrier 10. In this case, the support bar 15 may be assembled with the carrier 10 such that the support bar 15 and the carrier 10 become integrally connected. In order to assemble the support bars 15 to the carrier 10, a joining member may be provided at the first inner surface 17a and the second inner surface 17b of the carrier 10.

The support bars 15 are each separated from each other at a predetermined distance. The support bars 15 may be separated at a regular distance or at irregular distances. The sub bars 16 may be arranged on the support bar 15 to be separated at regular distances from neighboring support bars 15, or at irregular distances from neighboring support bars 15.

The number of the support bars 15 provided with the carrier 10 may increase in proportion to the size of the carrier 10. As the size of the carrier 10 increases, an optimal distance between the support bars 15 may be obtained and set through simulations and experimentation.

The cross-section of the support bars 15 may have various shapes that are known in the art. For example, the support bars 15 may be formed with cross-sections forming a circle, a rectangle, a triangle, a polygon, a semi-circle, an oval, or an atypical shape.

When a large substrate is placed and fastened on the frame 11, the large substrate may be bend toward the bottom of the carrier 10 due to the weight of the substrate. In this case, the support bars 15 support the large substrate to prevent the substrate from significantly bending. Therefore, the support bars 15 prevent the substrate from being damaged.

As described above, the carrier 10 including the support bars 15 substantially prevents the substrate from being damaged by supporting the substrate to prevent the substrate from bending toward the bottom of the carrier 10.

In embodiments where the carrier 10 is integrally formed with the support bars 15 or where the support bars 15 are rigidly mounted to the carrier, any deformation of the support bars 15 (due to high surrounding temperatures or pressures) would subject stresses on the carrier 10, which could potentially damage a substrate that is fastened to the carrier 10 with a clamp. In order to overcome this potential, an improved carrier 10 provided and shown in FIGS. 6A-6C.

Figure 6A:
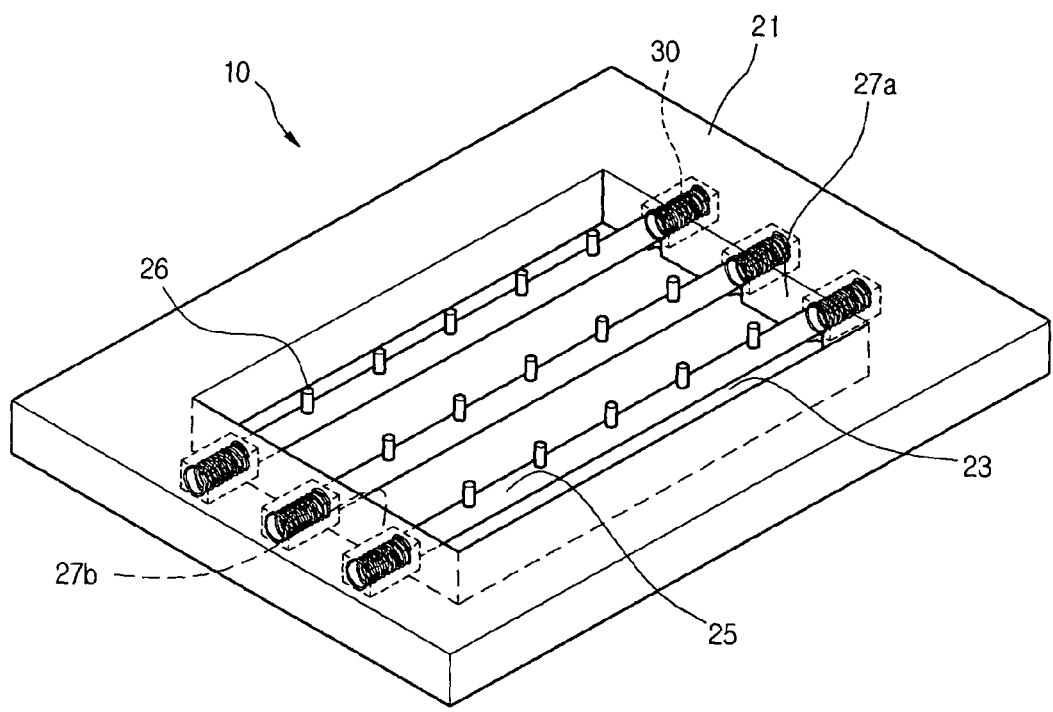
FIG. 6A is a perspective view of the carrier in accordance with a first embodiment.

As shown in FIG. 6A, a carrier 10 includes a rectangular frame 21 with a rectangular through-hole 23 at the center of the frame. The through-hole 23 includes a first inner surface 27a and a second inner surface 27b, with both inner surfaces 27a, 27b positioned to face each other within the through-hole 23.

Support bars 25 are disposed between a first inner surface 27a and a second inner surface 27b of the through-hole 23. The support bars 25 are positioned such that a first end of the support bar 25 is joined to the first inner surface 27a of the through-hole 23 and other side of the support bar 25 is joined to the second inner surface 27b.

Each of the support bars 25 include a plurality of sub bars 26 that project toward the front of the carrier 10. Each of the sub bars 26 are formed with a predetermined length and are separated form neighboring sub bars 26 at a predetermined distance. The sub bars 26 are provided to prevent the substrate from bending toward the bottom of the carrier 10 due to the weight of the substrate and the distance between the top surface of the carrier 10 and the top surface of the support bar 25.

Figure 6B:
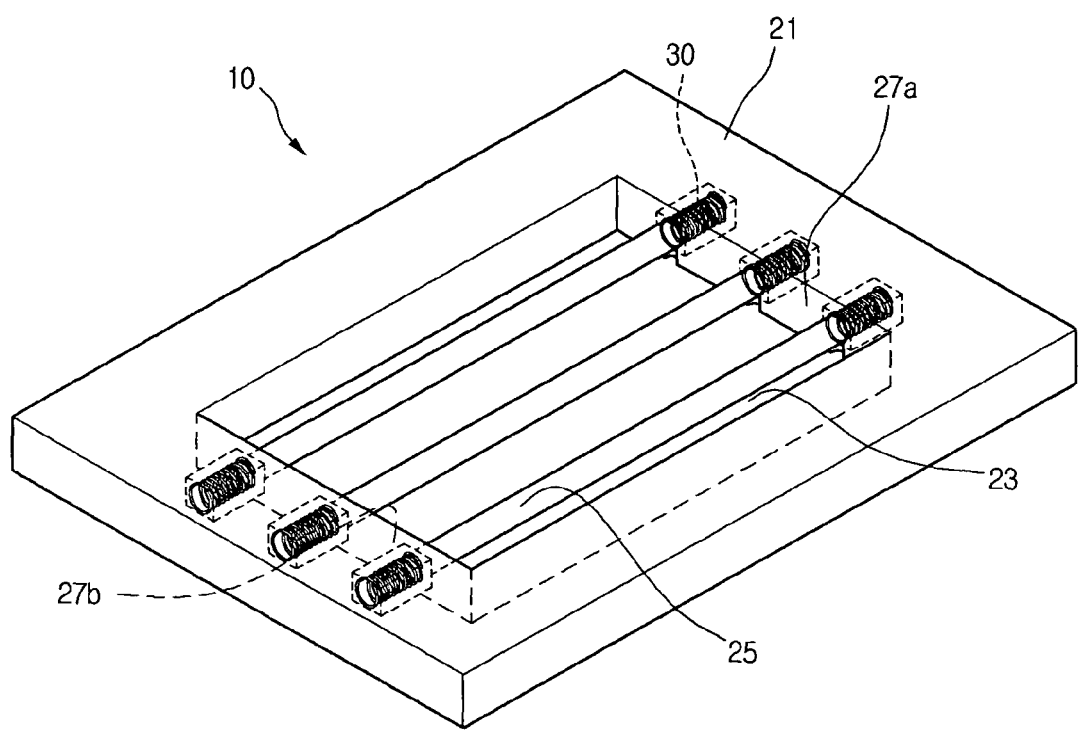
FIG. 6B is a perspective view of the carrier in accordance with a second embodiment.

As shown in FIG. 6B, the support bar 25 may be not include sub bars 26 when there is a relatively small distance between the top surface of the carrier 10 and the top surface of the support bar 25.

The carrier 10 may include a clamp (not shown) to fasten the substrate to the carrier. In some embodiments, the carrier 10 may be formed from a resin-based material or a similar material that is sufficiently durable to resist deformation in a high temperature and high pressure environment. The support bars 25 may be made of same material as the carrier 10, or may be made of different material than the carrier 10.

In some embodiments, the support bars 25 may be formed along with the carrier 10 as a single component. In other embodiments, the support bars 25 may be formed as separate components from the carrier 10 and then assembled with the carrier 10. A joining member may be provided at the first inner surface 27a and/or the second inner surface 27b of the carrier 10 to assemble the support bars 25 to the carrier 10.

The support bars 25 are separated one another at a predetermined distance with the number of the support bars 25 being in proportion to the size of the carrier 10. Accordingly, as the size of the carrier 10 increases, an optimal distance between neighboring support bars 25 and the optimal number of support bars 25 provided with the carrier may be determined through simulation and experimentation.

The distance between the support bars 25 need not be uniform and the support bars 25 may be separated at irregular distances. The support bars 25 may be arranged on the carrier 10 in parallel or at distinct angles with respect to each other.

In some embodiments, the support bars 25 may be joined to the carrier 10 by an elastic unit 30, which maintains the support bars 25 engaged with the carrier 10 and also allows the support bars 25 to move in a longitudinal direction. Therefore, the elastic unit 30 prevents the carrier 10 from being deformed by when the support bars 25 deform in a high temperature or pressure environment, because the elastic unit 30 allows for some freedom of movement of the support bars 25 with respect to the carrier 10. For example, when the substrate is positioned in a high temperature or environment to perform a specific manufacturing step, the support bars 25 may deform or expand. As the support bars 25 deform, the elastic unit 30 absorbs the deformation so that the carrier 10 does not feel significant stresses due to the deformation or expansion of the support bars 25. Therefore, the elastic unit 30 prevents the substrate from being damaged due to the transformation of the carrier 10.

Figure 6C:
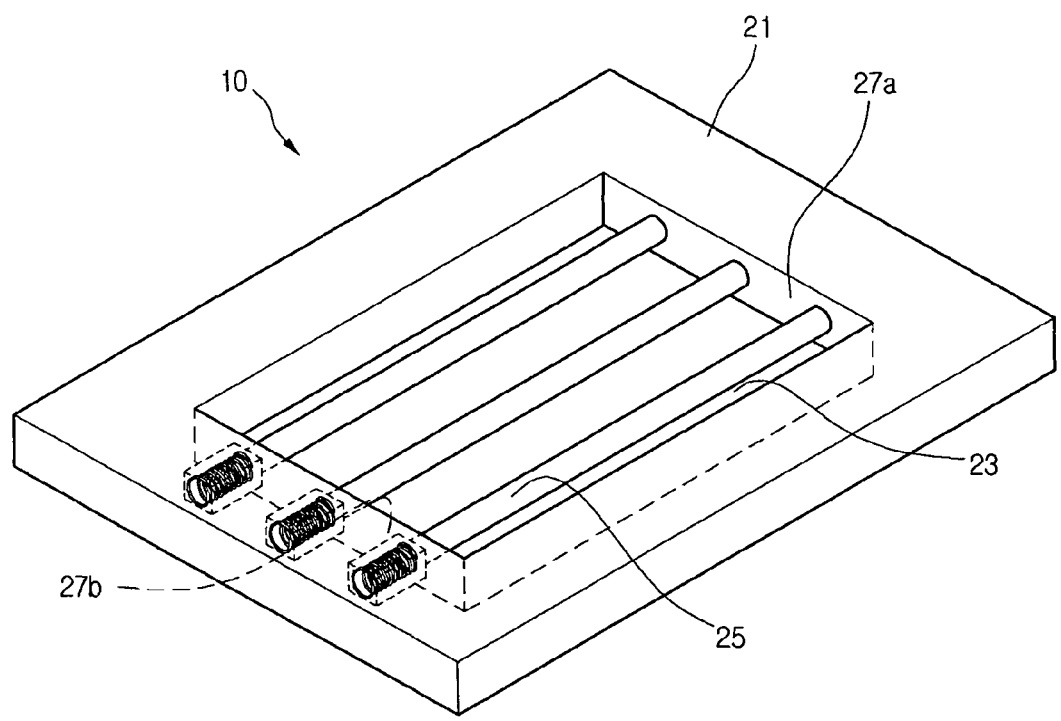
FIG. 6C is a perspective view of the carrier in accordance with a third embodiment.

As shown in FIG. 6C, the elastic unit 30 may be formed at one end of the support bar 25, or as shown in FIGS. 6a and 6b, the elastic unit 30 may be provided at both ends of the support bar 25.

Figure 7A:
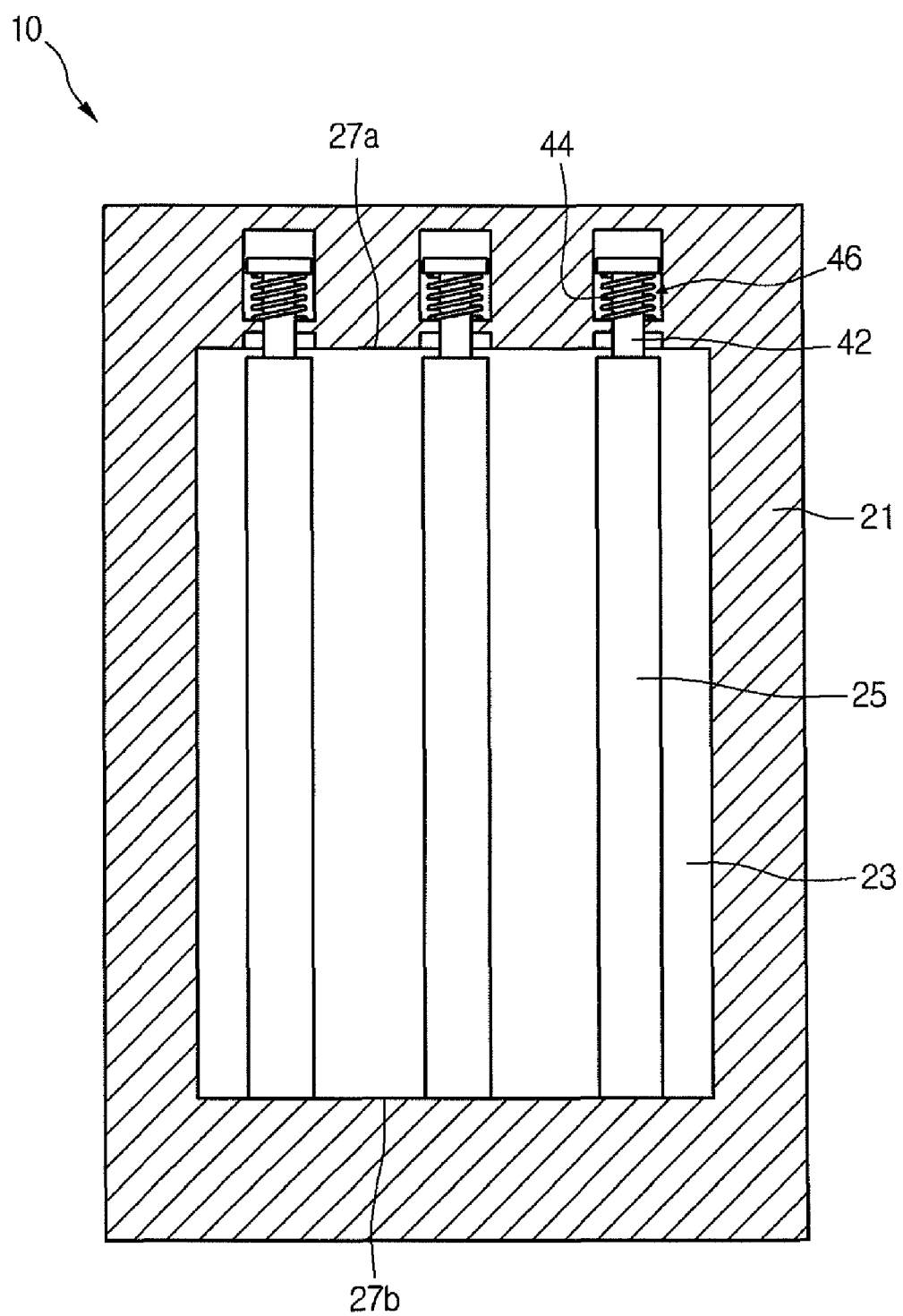
FIG. 7A is a plan view of a carrier according to a fourth embodiment of the present invention.
Figure 7B:
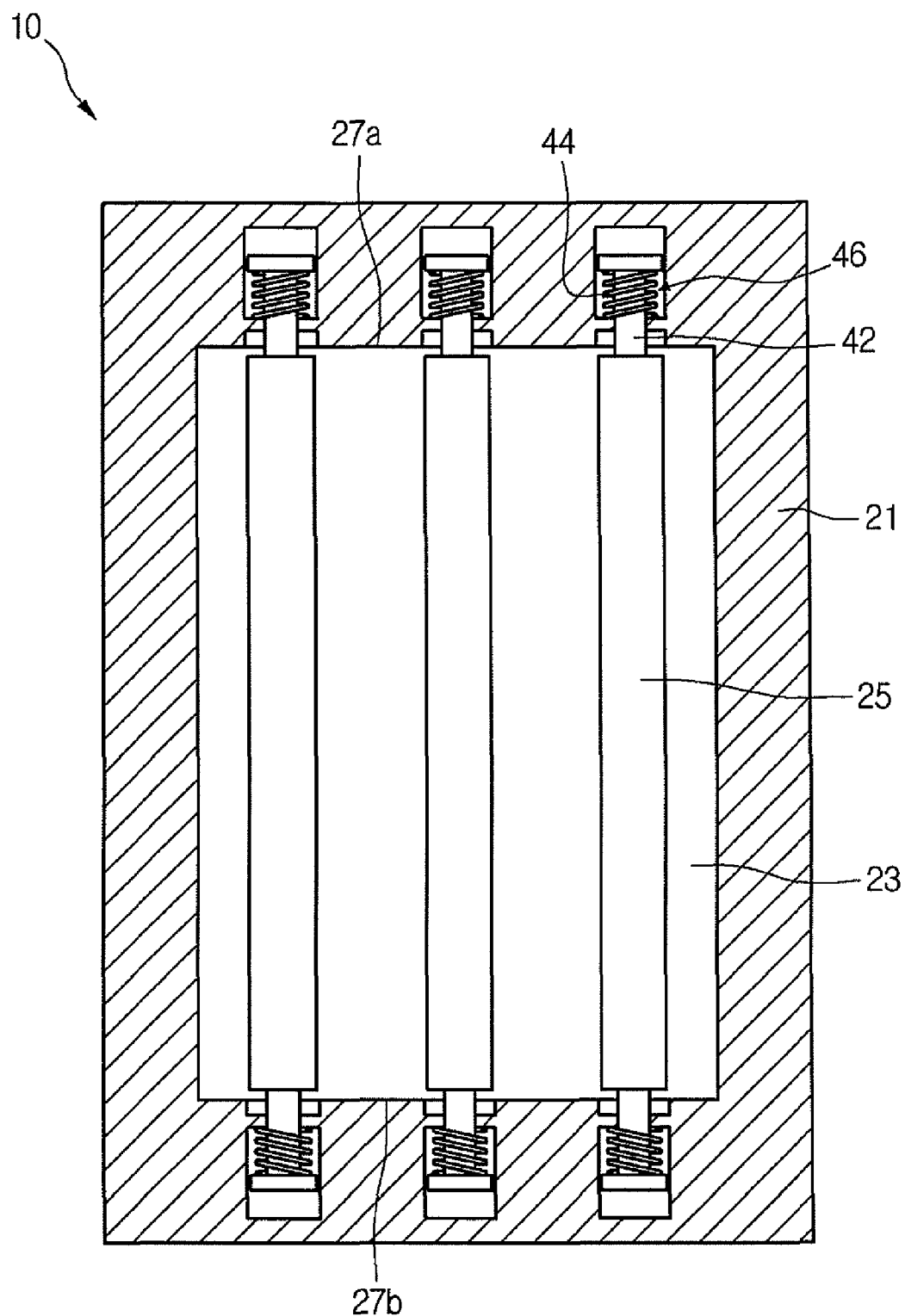
FIG. 7B is a plan view of another carrier according to the fourth embodiment of the present invention.

As shown in FIG. 7A, the carrier 10 includes the elastic unit 30 formed at one end of the support bar 25. Also, as shown in FIG. 7B, the carrier 10 may include elastic units 30 formed at both ends of the support bar 25.

Figure 8A:
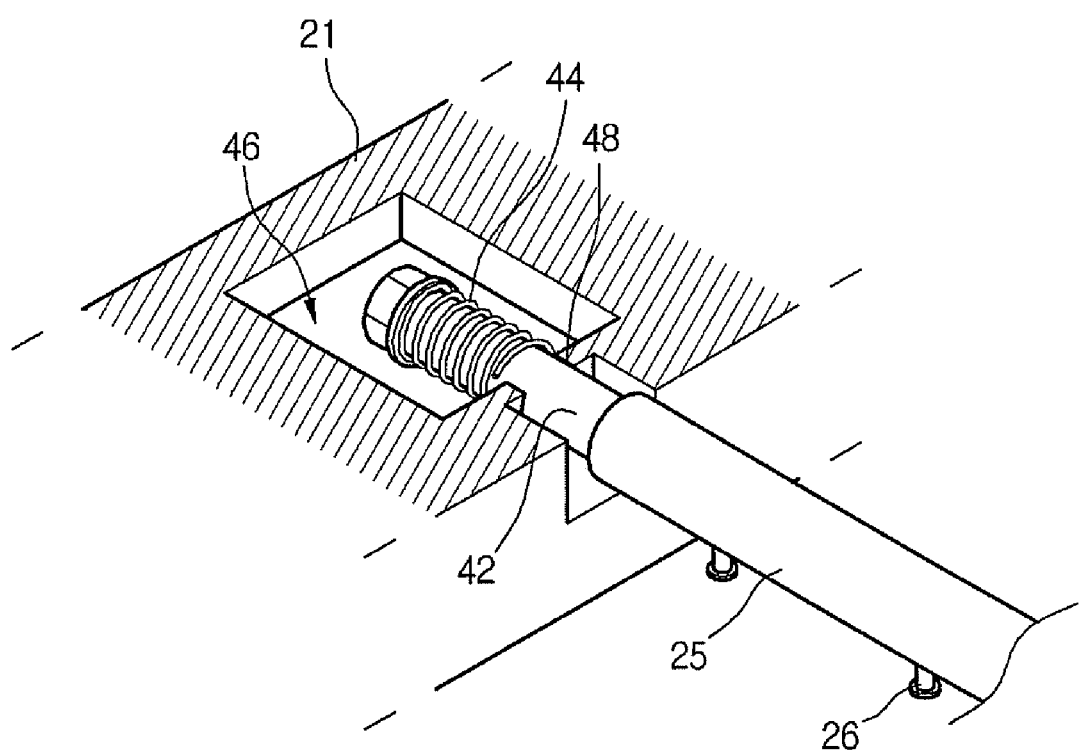
FIG. 8A is a perspective view of an elastic unit in a carrier in accordance with the fourth embodiment of the invention.
Figure 8B:
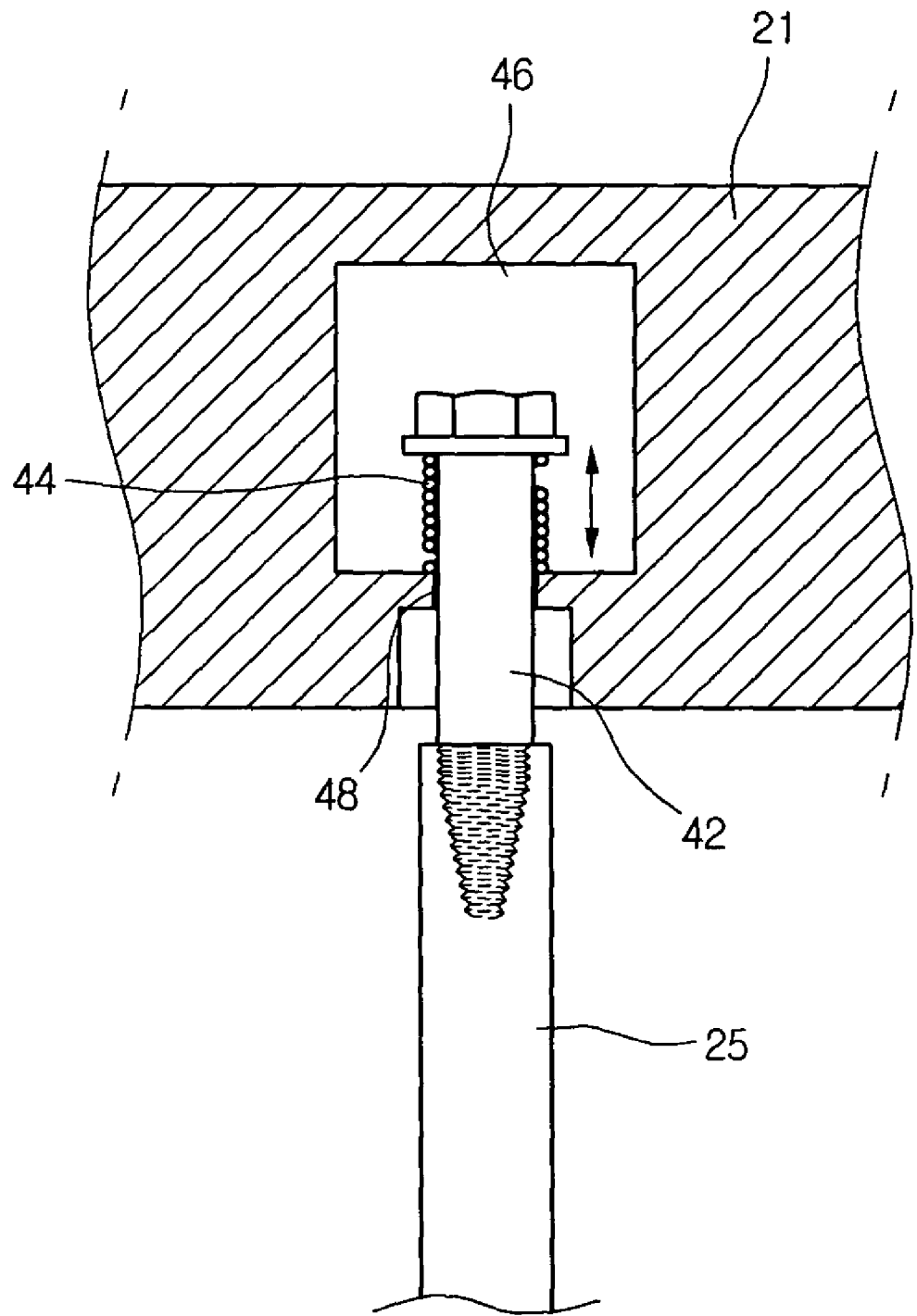
FIG. 8B is a front view of the elastic unit of FIG. 8A.

As shown in FIG. 8A, the elastic unit 30 may be joined to the support bar 25 through a predetermined space 46 of the carrier 10. The elastic unit 30 includes a joining member 42 fixed to the support bar 25 through a hole 48 formed between the inner surfaces 27a and 27b and the predetermined space 46 and an elastic member 44 that surrounds at least a portion of the joining member 42 to control a movement of the joining member 42 fixed at the support bar 25. The joining member 42 may be a screw and the elastic member 44 may be a spring. In some embodiments, the spring may be a compression spring or an extension spring. It is preferable to use the compression spring in the present embodiment.

When the elastic unit 30 is only provided at one end of the support bar 25, other end of the support bar 25 may be fixed at the opposite inner surface. Also, the support bar 25 may be integrally formed with the frame 21. Furthermore, the support bar 25 and the frame 21 may be separately formed with different materials. In this case, the support bar 25 and the frame 21 are assembled together.

In order to prevent the support bar 25 from extending into the predetermined space 46 through the hole 48, the diameter of the hole 48 may be smaller than the diameter of the support bar 25.

In a preferred embodiment, the diameter of the joining member 42 is smaller than the diameter of the hole 48, which allows the joining member 42 to smoothly extend the hole 48. A female screw thread may be tapped on an end of the support bar 25 to receive and engage a male threaded end of the joining member 42. The elastic unit 30 may be joined to the support bar 25 by inserting the elastic member 44 around the joining member 42 and attaching the joining member 42 to the support bar 25 through the hole 48 of the predetermined space 46 of the carrier.

When a substrate placed on the carrier 10 is processed in a high temperature or high pressure environment, the support bar 25 may be deformed or expanded. If the support bar 25 is deformed or expanded, the elastic unit 30 allows the support bar 25 and the joining member 42 to move into the predetermined space 46 in the carrier 10 in proportion to the amount of deformation or expansion of the support bar 25. Because the support bar 25 is free to expand within the carrier 10, the carrier does not feel any additional stresses due to the deformation or expansion of the support bar 25. Accordingly, the carrier is not deformed due to stress from engagement with the deformed or expanded support bar 25, and the substrate provided on the carrier 10 by the clamp is not damaged.

The support bar 25 may include a plurality of sub bars 26 projecting from the support bar 25 toward a front surface of the carrier 10. The sub bars 26 are normally separated from neighboring sub bars 26 at a predetermined distance. The sub bars 26 are provided to prevent the substrate from bending toward the bottom of the carrier 10 due the space between the top surface of the carrier 10 and the top surface of the support bar 25 and the weight of the substrate. In embodiments where there is only a small space between the sub bars 26 between the top surface of the carrier 10 and the top surface of the support bar 25, the sub bars 26 need not be provided.

The carrier 10 may be transferred from a chamber to another chamber in a manufacturing apparatus having a plurality of chambers. While the carrier 10 is transferred between the plurality of chambers, the carrier 10 may be positioned horizontally, vertically, or inclined at a predetermined oblique angle.

Figure 9A:
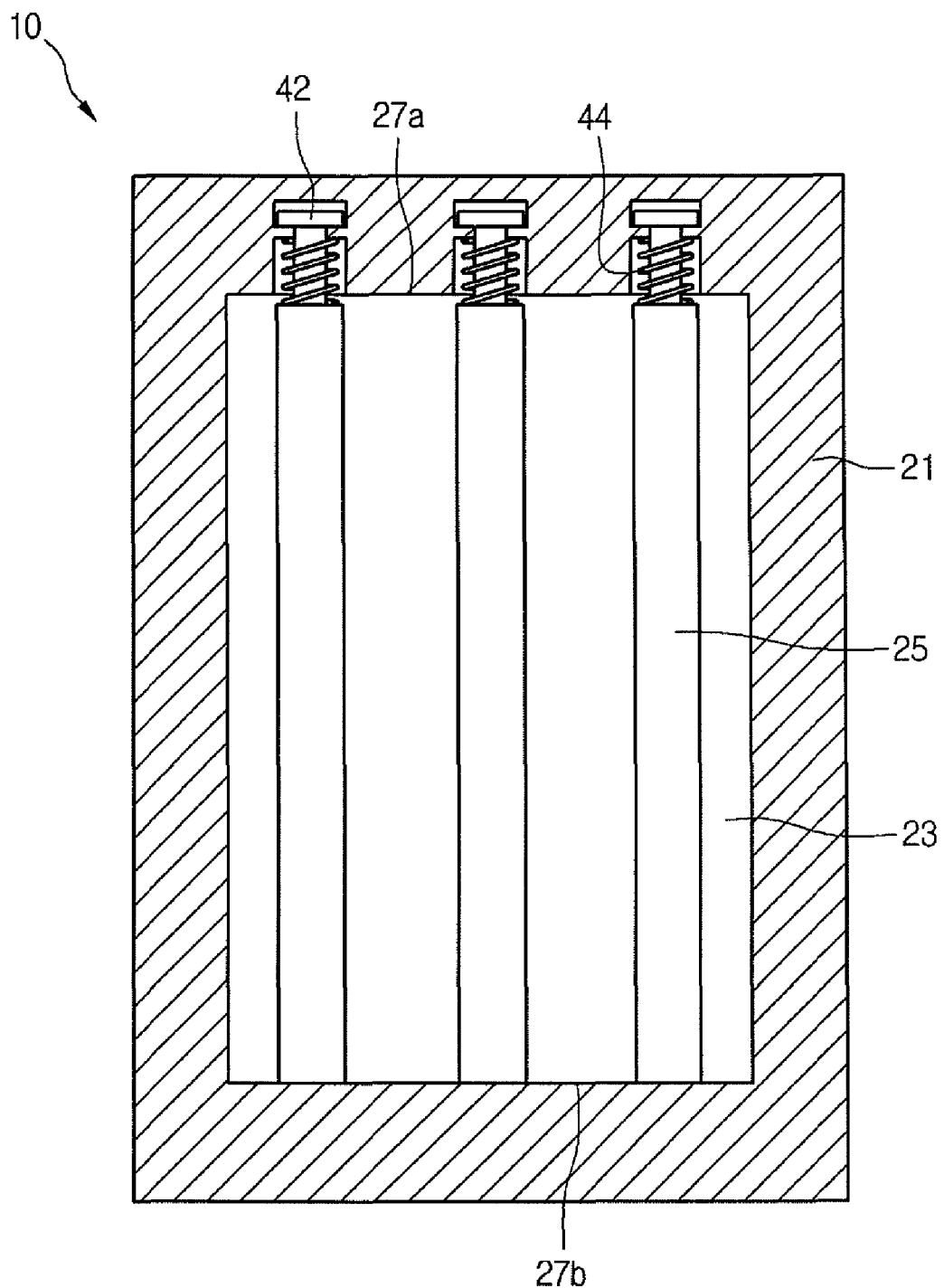
FIG. 9A is a plan view of a carrier according to a fifth embodiment of the present invention.
Figure 9B:
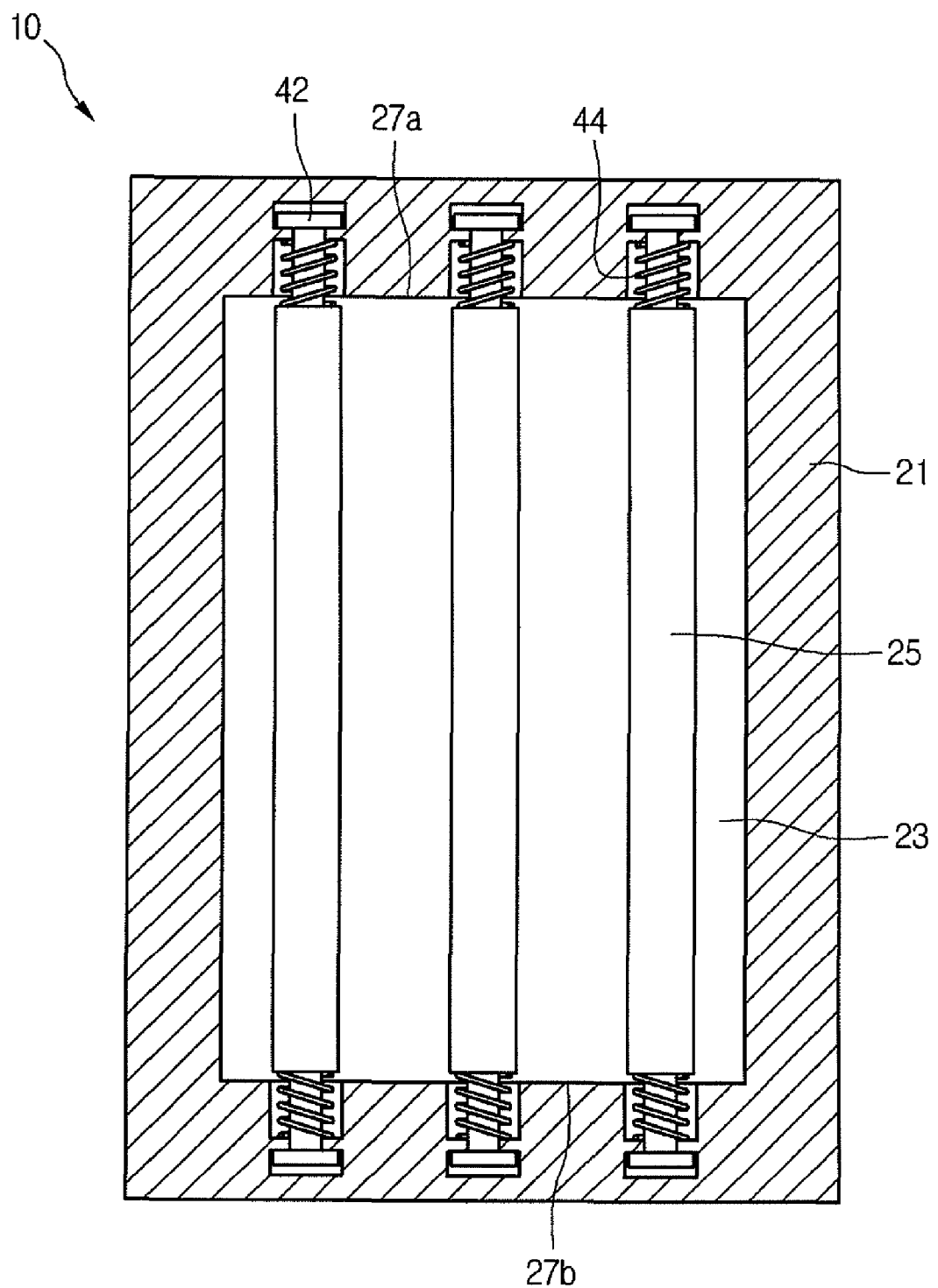
FIG. 9B is a plan view of an alternate carrier according to the fifth embodiment of FIG. 9A.

As shown in FIG. 9A, the carrier 10 may include an elastic unit 30 comprising an elastic member 44 and a fastening member 42 (as discussed above) disposed at one end of a support bar 25. As shown in FIG. 9B, the carrier 10 may include elastic units 30 disposed at the both ends of the support bar 25.

Figure 10A:
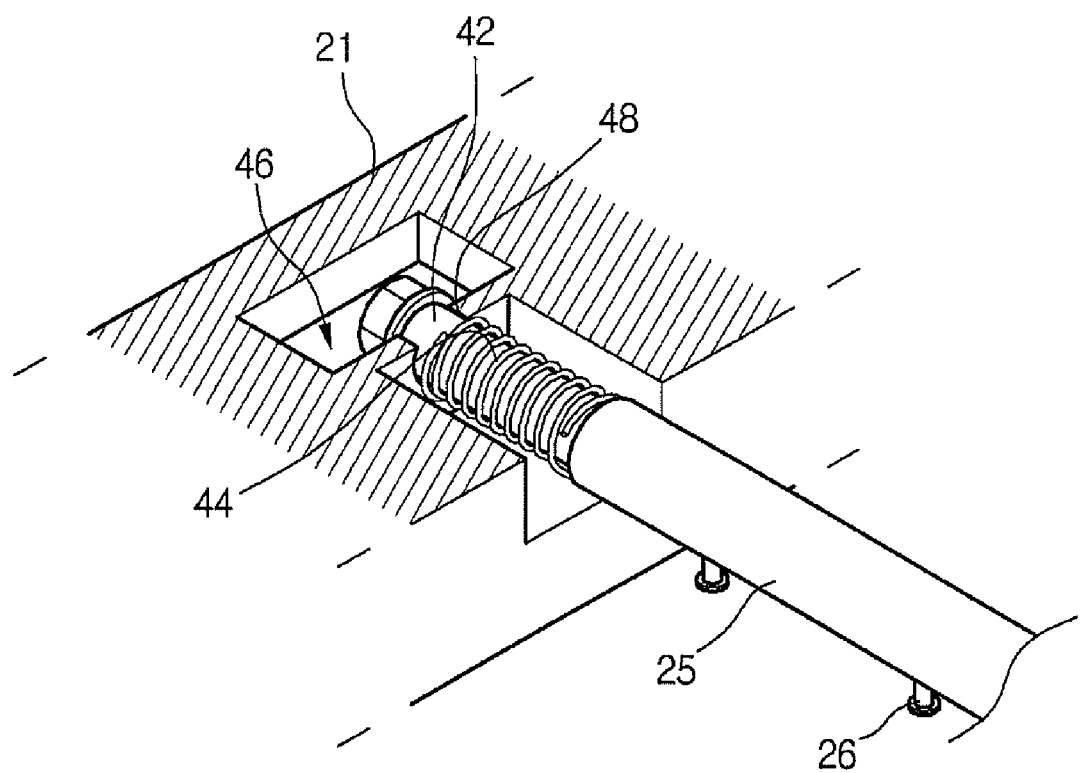
FIG. 10A is a perspective view of an elastic unit according to the embodiment of FIG. 9A.
Figure 10B:
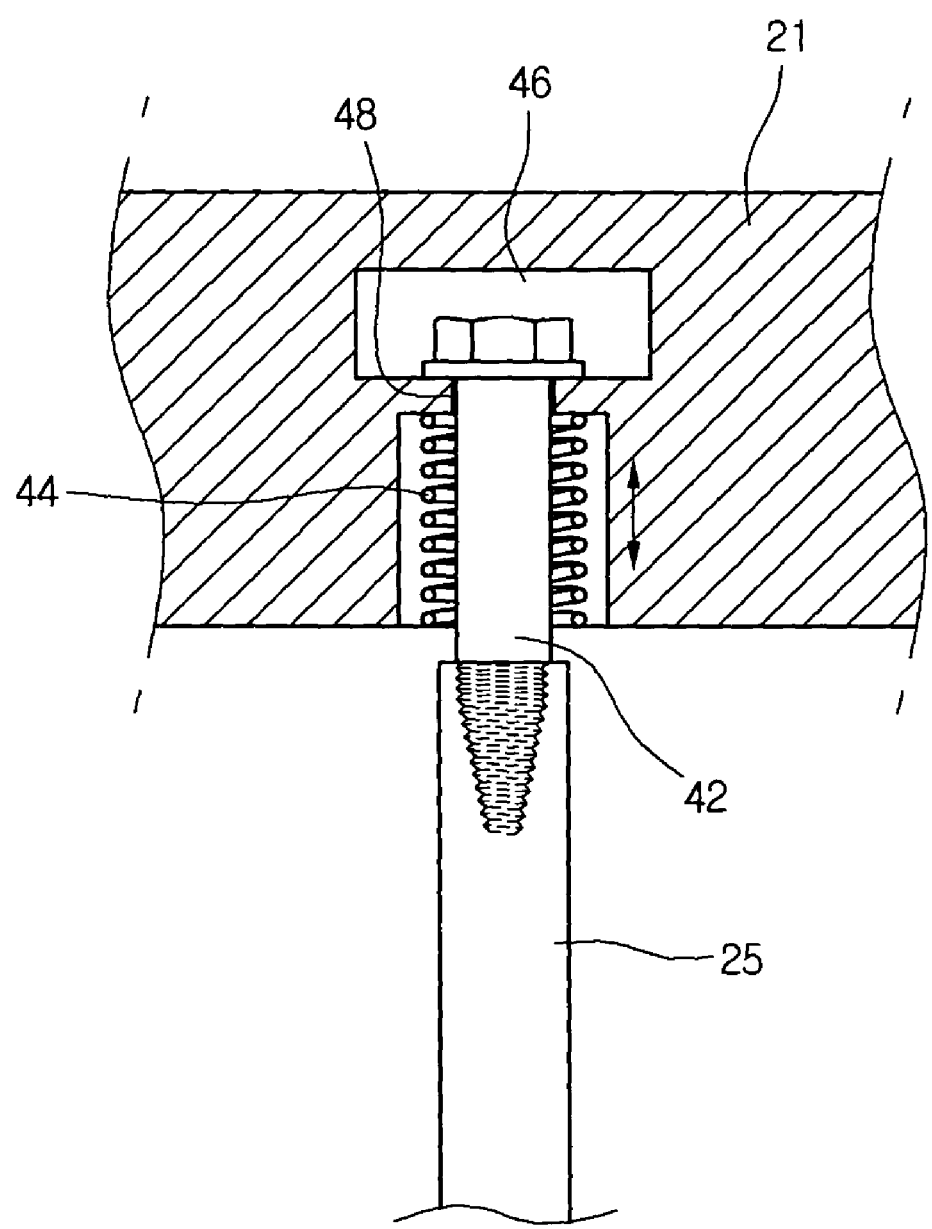
FIG. 10B is a front view of an elastic unit in the carrier according to the FIG. 10A.

As shown in FIG. 10A, the elastic unit 30 may be joined to one end of the support bars 25 or in other embodiments joined to both ends of the support bar 25. The elastic unit 30 includes a joining member 42 fixed to the support bar 25 that extends into a predetermined space 46 and a hole 48 formed through the inner surfaces 27a and 27b and an electric member 44 disposed to surround the joining member 42 for controlling a movement of the support bar 25. The joining member 42 may be a screw and the elastic member 44 may be a spring. The spring may be a compression spring or an extension spring, with an extension spring being preferred. One end of the extended spring may be fixed on the support bar 25 and other end of the extended spring may be fixed on the frame 21.

When a substrate placed on the carrier 10 is processed by a predetermined manufacturing process in a high temperature and/or high pressure environment, the support bar 25 may be deformed or expanded by the heat generated from the high temperature and high pressure manufacturing process. If the support bar 25 is deformed or expanded, the elastic unit 30 allows the support bar 25 to move into the predetermined space 46 in proportion to the amount that the support bar 25 deformed or expanded. Accordingly, the joining member 42 moves into the predetermined space 46 through the hole 48 as much as the transformed amount of the support bar 25 with the elastic member 44 interposed. Therefore, although the carrier 10 does not feel any stress due to deformation or expansion of the support bar 25 and the substrate fastened on the carrier 10 by the clamp is prevented from being damaged. The support bar 25 may include a plurality of sub bars 26 projected from the support bar 25 at a predetermined height to additionally support the substrate and prevent the substrate from bending toward the bottom of the carrier 10 due to the weight of the substrate.

Figure 11A:
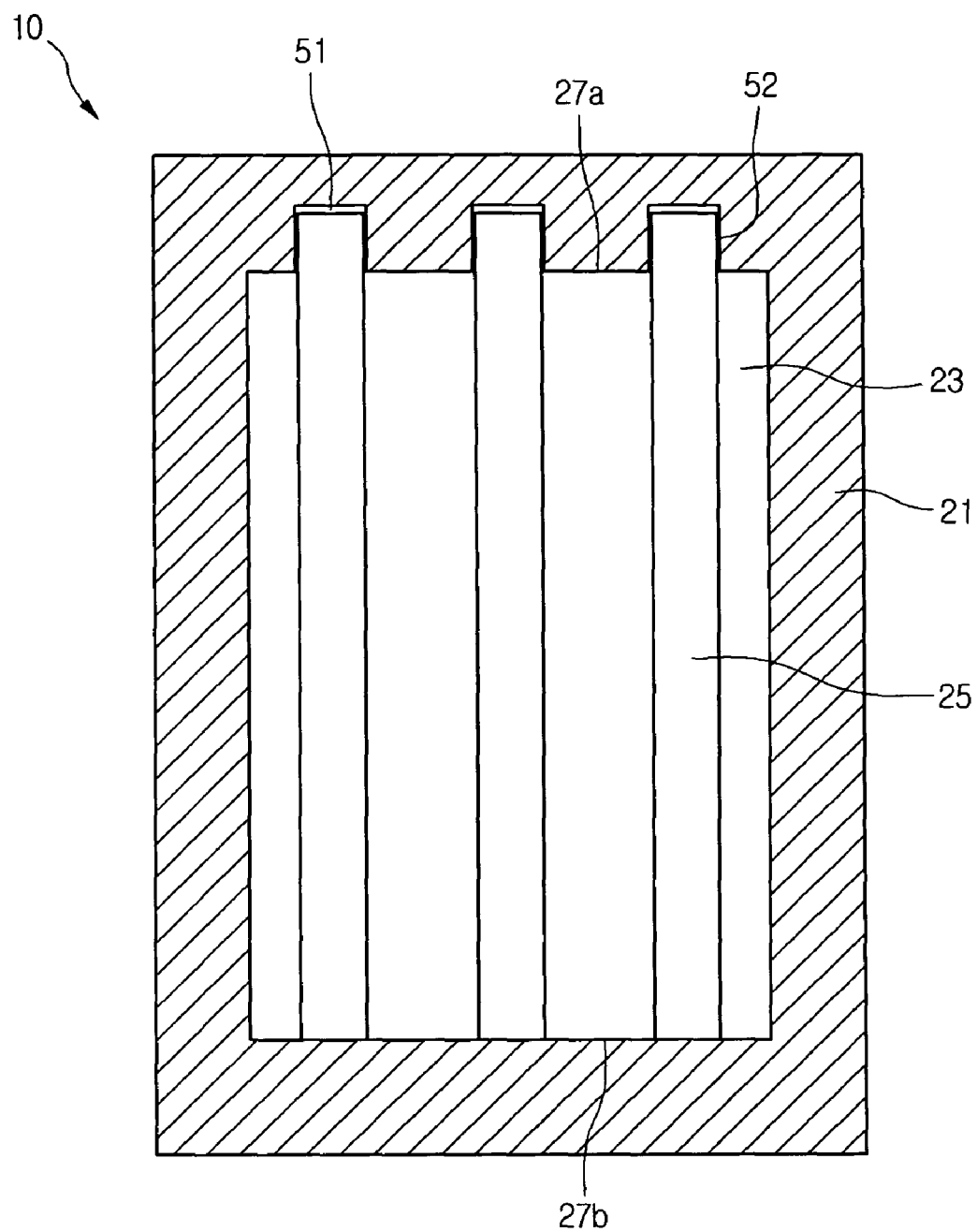
FIG. 11A is a plan view of a carrier according to a sixth embodiment of the present invention.
Figure 11B:
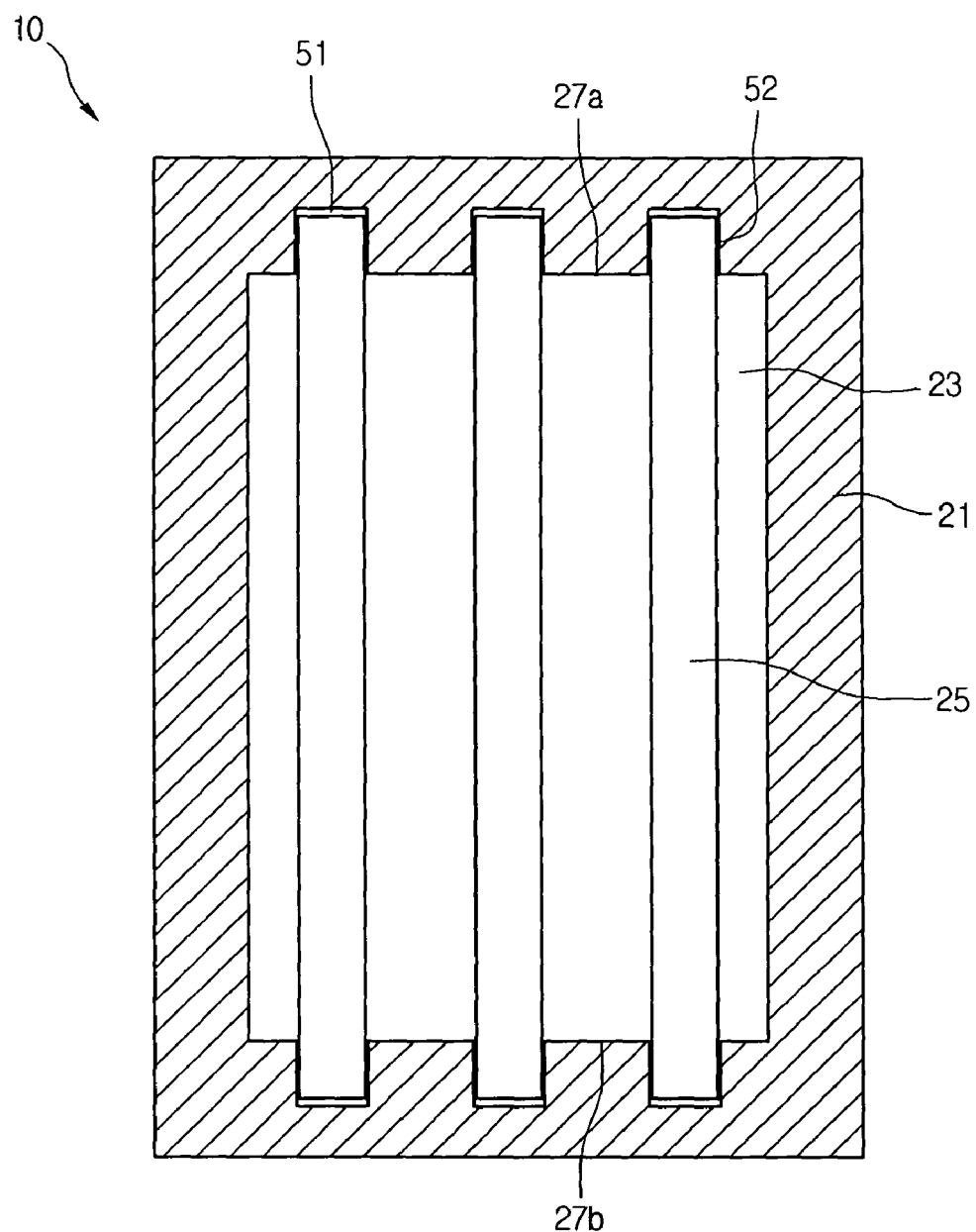
FIG. 11B is a plan view of an alternate carrier according to the sixth embodiment of FIG. 11A.

As shown in FIG. 11A, the carrier 10 includes a separation space 51 provided between one end of the support bar and the carrier 10. As shown in FIG. 11B, the carrier 10 may include similar separation spaces 51 formed at both ends of the support bar 25. The plurality of support bars 25 may be arranged in the through-hole 23 of the carrier 10. A first end of the support bar 25 is connected to a first inner surface 27a of the through-hole 23 of the carrier 10 and the opposite side of the support bar 25 is connected to a second inner surface 27b of the through-hole 23.

A selected end of the support bar 25 may be inserted into a predetermined shaped groove 52 formed at the first inner surface 27a, which includes a predetermined separation space 51. The separation space 51 provides room for the support bar 25 to expand or deform when the support bar 25 is subject to a high temperature or pressure environment.

Accordingly, if the support bar 25 is expanded or deformed due to the surroundings with one end of the support bar 25 being fixed at the first inner surface 27b and the opposite end of the support bar 25 inserted into the groove 52 provided with a separation space 51, the extended support bar 25 may expand into the separation space 51 formed at the one end of the support bar 25, which limits any forces imparted to the carrier 10. In some embodiments, an elastic member 44 may be inserted at the separation space 25.

Figure 12A:
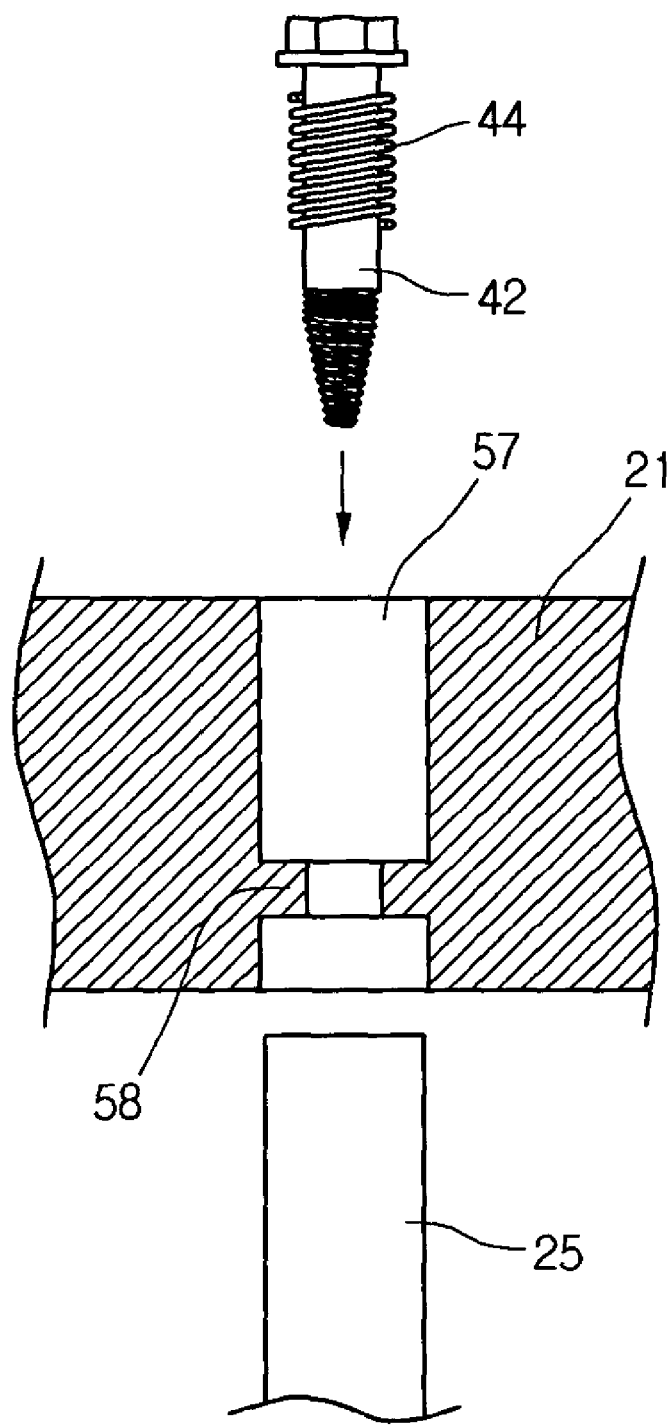
FIG. 12A is an exploded view illustrating a method of assembling a frame and a support bar of the carrier.
Figure 12B:
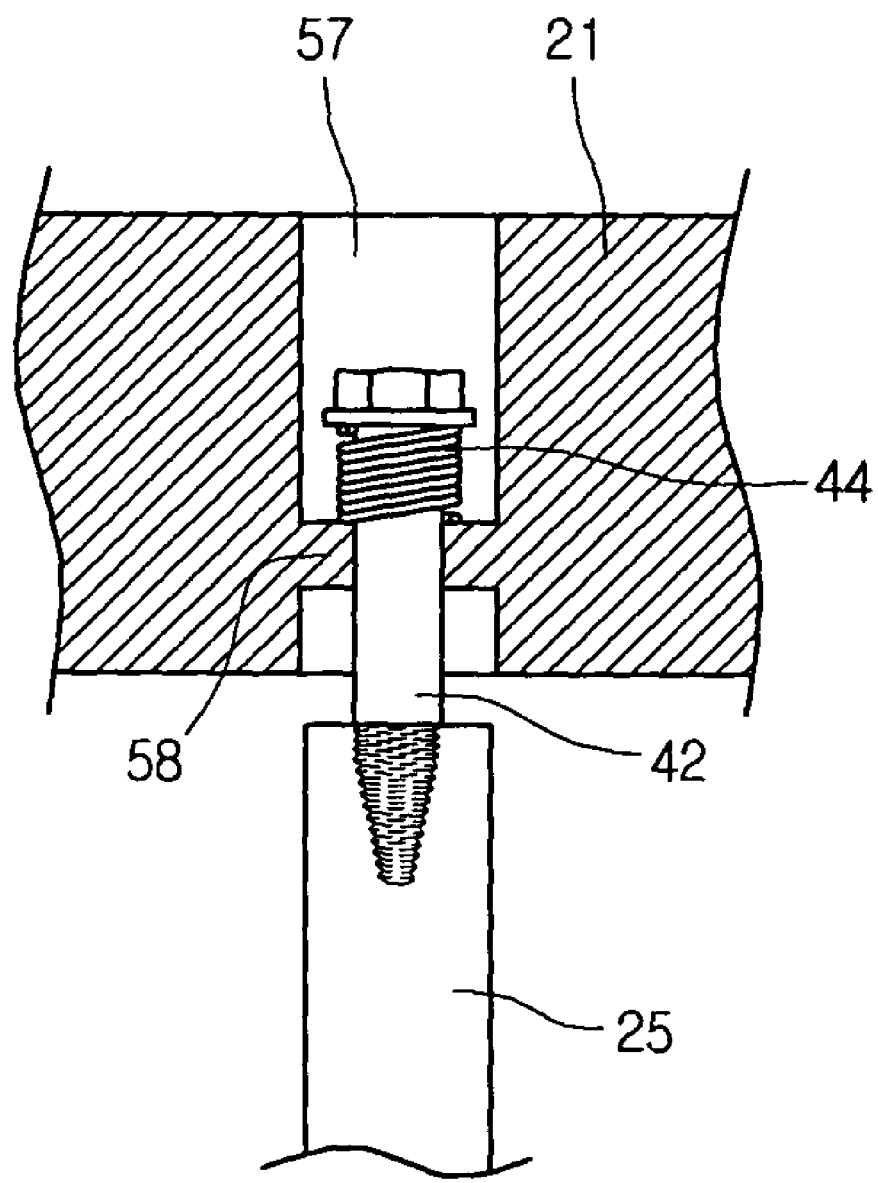
FIG. 12B is a plan view of the assembled frame and support bar within the carrier.

As shown in FIGS. 12A and 12B, a through-hole 57 may be formed at an outer surface of the frame 21. The through-hole 57 penetrates the frame 21 from the outer surface of the frame 21 to the inner surface of the frame 21. A joining member 42 may be inserted through the hole 57 and joined to a support bar 25.

When the joining member 42 is inserted through the hole 57, an elastic member 44 is disposed around the joining member 42 and the joining member 42 with the elastic member 44 is joined to the support bar 25 through the hole 57.

A protrusion 58 may be formed at an inner surface of the hole 57. The protrusion 58 blocks and compresses the elastic member 44, preventing the elastic member 44 from pressing completely through the hole 57.

Figure 13A:
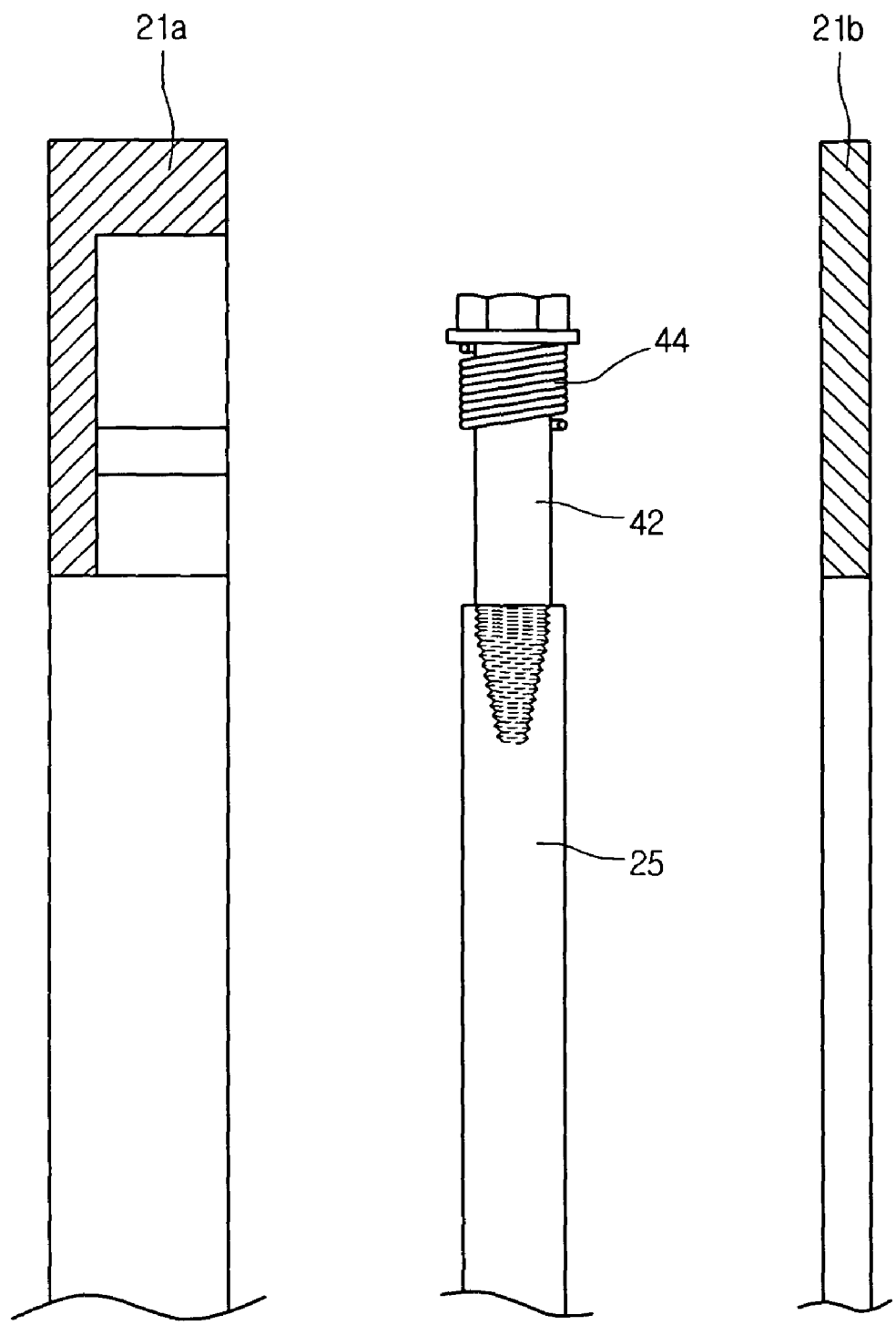
FIG. 13A is an exploded view of a method of assembling a frame and a support bar of the carrier.
Figure 13B:
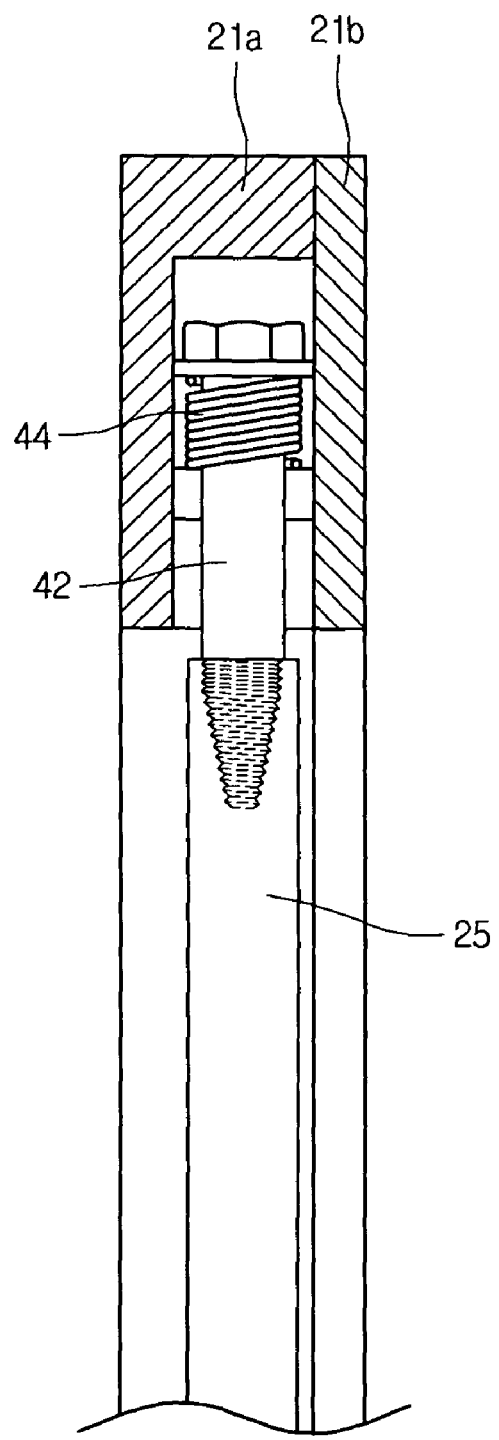
FIG. 13B is a plan view of the assembled frame and support bar of the carrier.

As shown in FIG. 13A, a rectangular frame 21 may include a first frame 21a and a second frame 21b. After a support bar 25, which may include an elastic unit 44, is assembled with the first frame 21a, the second frame 21b is assembled and fixed to the first frame 21a to substantially cover a surface of the first frame 21a. For the sake of brevity, the structure and operation of the carrier 10 and the support bar 25 are not fully described here, but each of the carrier and the support bar 25 are formed and operate similarly to the embodiments discussed above.

As described above, the carrier according to the present invention includes a plurality of support bars in the center portion of the carrier to support the substrate to be bended toward the bottom. Therefore, the carrier according to the present invention prevents a substrate riding on the carrier from being damaged due to bending under its own weight.

Also, the carrier according to the present invention includes an elastic unit disposed between the support bar and the frame in order to allow the support bar to move when the support bar is deformed or expanded. Accordingly, the carrier according to the present invention is not deformed when the support bar is deformed or expanded in a high temperature and high pressure environment. Therefore, the carrier according to the present invention prevents a substrate placed on the carrier from being damaged.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A carrier for a sputtering apparatus for transporting a substrate comprising:
   a frame with a substantially planar upper surface configured to support a substrate, the upper surface defines a through-hole at a center, wherein the through-hole includes a first inner surface and a second inner surface that faces the first inner surface in the through-hole;
   a plurality of support bars each joined to the first inner surface and the second inner surface and having free movement at the joined portion;
   first and second grooves formed at the first and second inner surfaces; and
   first and second elastic units joined to both ends of each support bar,
   wherein the support bars are disposed below a lower surface of the substrate;
   wherein each support bar is inserted into the first and second grooves,
   wherein each elastic unit includes:
   a joining member engaged with the support bar in the through-hole through a hole near each inner surface;
   an elastic member configured to surround the joining member for controlling a movement of the joining member; and
   a plurality of sub bars that project from the support bars in a direction that is substantially transverse to a longitudinal axis of the support bars by a first distance and that are separated from neighboring sub bars by a second distance,
   wherein top surfaces of the sub bars are substantially in the same plane as the planar top surface of the frame so as to support the lower surface of the substrate.

2. The carrier according to claim 1, wherein the support bar is made from the same material as the frame.

3. The carrier according to claim 2, wherein the material is a resin-based material.

4. The carrier according to claim 1, wherein the support bar is made of a different material than the carrier.

5. The carrier according to claim 1, wherein the hole is formed between each groove and the through-hole.

6. The carrier according to 1, wherein the joining member is a screw.

7. The carrier according to 1, wherein the elastic member is a spring.

8. The carrier according to claim 5, wherein the elastic member is disposed within the cavity.

9. The carrier according to claim 5, wherein the elastic member is disposed between the support bar and one of the first inner surface or the second inner surface.

10. The carrier according to claim 9, wherein one end of the elastic member is fixed to the frame and an opposite end of the elastic member is fixed to the support bar.

11. The carrier according to claim 1, further comprising a hole extending from an outer surface of the frame to the inner surface of the frame.

12. The carrier according to claim 11, wherein a protrusion partially extends into the hole.

13. The carrier according to claim 1, wherein a distance between the plurality of support bars is uniform.

14. The carrier according to claim 1, wherein a distance between the plurality of support bars is irregular.

15. The carrier according to claim 1, wherein the support bars are arranged in parallel to neighboring support bars.

16. The carrier according to claim 1, wherein a cross-section of the support bar is a shape selected from the group consisting of a circle, a rectangle, a triangle, a polygon, an oval, or an atypical shape.

17. The carrier according to claim 1, wherein a diameter of the hole is equal to or smaller than a diameter of the support bar.

18. The carrier according to claim 1, wherein a diameter of the joining member equal to or smaller than a diameter of the hole.

19. The carrier according to claim 1, wherein a female screw thread is formed at an end of the support bar to be joined with a corresponding male screw thread of the joining member.

20. The carrier according to claim 1, wherein one end of the support bar is fixed at the frame.

* * * * *

UNITED STATES PATENT AND TRADEMARK OFFICE
CERTIFICATE OF CORRECTION

PATENT NO.         : 8,267,253 B2                                      Page 1 of 1
APPLICATION NO.    : 11/476362
DATED              : September 18, 2012
INVENTOR(S)        : Sung Eun Kim et al.

It is certified that error appears in the above-identified patent and that said Letters Patent is hereby corrected as shown below:

On the Title Page

Left column, item (73), immediately after "LG Display Co., Ltd., Seoul (KR)" insert --; LG Electronics Inc., Seoul (KR); AVACO CO., Ltd., Seoul (KR)--.

Signed and Sealed this
Second Day of February, 2016

Michelle K. Lee
*Director of the United States Patent and Trademark Office*